United States Patent
Callahan, Jr.

(10) Patent No.: US 7,385,433 B2
(45) Date of Patent: Jun. 10, 2008

(54) ANALOG SWITCH WITH REDUCED PARASITIC BIPOLAR TRANSISTOR INJECTION

(75) Inventor: Michael J. Callahan, Jr., Austin, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 141 days.

(21) Appl. No.: 11/083,531

(22) Filed: Mar. 18, 2005

(65) Prior Publication Data

US 2006/0208787 A1 Sep. 21, 2006

(51) Int. Cl.
*G05F 1/10* (2006.01)

(52) U.S. Cl. ...................................................... 327/534

(58) Field of Classification Search .................. 327/77, 327/88, 403, 404, 407, 408, 415, 416, 534
See application file for complete search history.

(56) References Cited

U.S. PATENT DOCUMENTS

| | | |
|---|---|---|
| 4,994,886 A | 2/1991 | Nadd |
| 5,986,947 A | 11/1999 | Choi et al. |
| 6,163,487 A | 12/2000 | Ghilardelli |
| 6,218,707 B1 | 4/2001 | Soldavini .................... 257/371 |
| 6,424,203 B1 * | 7/2002 | Bayadroun .................. 327/536 |
| 6,456,150 B1 | 9/2002 | Sacco et al. |
| 6,525,594 B2 * | 2/2003 | Fugate et al. ............... 327/534 |
| 7,084,697 B2 * | 8/2006 | Kawagoshi .................. 327/536 |

OTHER PUBLICATIONS

Allen, Phillip E., et al., "CMOS Analog Circuit Design," Holt, Rinehart & Winston, Fort Worth, 1987, p. 209.

* cited by examiner

*Primary Examiner*—Jeffery S Zweizig
(74) *Attorney, Agent, or Firm*—Lisa K. Jorgenson; David V. Carlson

(57) ABSTRACT

According to the invention a well-switching arrangement, with a semiconductor circuit including a switch having an input terminal, an output terminal and a body region and at least one comparator having a first input coupled to at least one of the terminals and a second input coupled to a positive voltage rail, and logic coupled to an output of the comparator and responsive to the output to selectively couple the body-well region to one of the terminals or to the positive voltage rail.

30 Claims, 11 Drawing Sheets

ANALOG SWITCH WITH REDUCED PARASITIC BIPOLAR TRANSISTOR INJECTION

BACKGROUND OF THE INVENTION

1. Field of the Invention

The present invention is directed to an analog electronic switch circuit with reduced current leakage when the voltage on the input or output of the switch goes either below ground level voltage or above positive rail voltage.

2. Description of the Related Art

Electronic switches in integrated circuits ("IC") are commonly constructed with Complementary Metal Oxide Semiconductor transistors ("CMOS") in which an n-channel transistor and a p-channel transistor are directly coupled at their input and output terminals. The switch is controlled by a drive signal applied to both transistor gates in a complementary fashion to make both transistors ON or OFF simultaneously.

FIG. 1 shows a double-diffused CMOS substrate 10 with an n-well region 16 and a p-well region 14 isolated from the substrate 10. These well regions may be the bodies of P-channel and N-channel transistors of a CMOS analog switch. FIG. 2 shows a conventional CMOS transmission gate analog switch 28, with complementary switch transistors 22 and 24 as described above and complementary drive signals 40 and 26 for their respective gates. The body terminals 34 and 36 of switch transistors are connected to their respective voltage rails, as shown in FIG. 2.

In IC's which contain CMOS electronic switches, unintended parasitic bipolar transistors may be formed due to the interaction of the p-n junctions which are in close vicinity of each other. Such a parasitic transistor 17 is shown in FIG. 1. The switch functions correctly when the input voltage is between ground and high voltage supply levels. That is, the switch is in open or closed state depending on the state of the drive signals and little or no unintended current leakage occurs. However, the parasitic transistors can turn on and conduct under certain conditions, which results in undesirable current leakage. Conditions under which current leakage takes place occur when the input voltage on the switch input terminal goes beyond the negative or positive rail voltages, that is, when the input voltage becomes more negative than ground or exceeds the positive supply voltage, thus causing conduction in the parasitic bipolar transistors. In FIG. 2, the input terminals of the transistors 22 and 24 are connected to each other to form a common input terminal 32 and the outputs are connected to each other to form a common output terminal 30. A switch signal on line 38 is input to the gate of 24 and via inverter 20, to the gate of 22 to enable or disable the switch for passing the input signal to the output terminal 30.

In the prior art, a number of approaches have been taken to prevent or minimize this leakage current. For example, U.S. Pat. Nos. 6,218,707 and 5,834,826 provide proposed solutions to this problem, both of which are incorporated herein by reference.

SUMMARY OF THE INVENTION

According to the principles of the present invention, a switch has its body region coupled alternatively to one of the supply voltage levels or an input or output terminal. The terminal whose voltage is the most negative or positive, for N-channel or P-channel, respectively, is coupled to the body region to reduce or eliminate the parasitic bipolar transistor conduction. For one embodiment, this operation is accomplished by a circuit having at least one comparator with a first input coupled to at least one of the switch terminals and a second input coupled to a voltage supply node, and logic coupled to an output of the comparator and responsive to the output to selectively couple the body region to one of the terminals or to the voltage supply node.

BRIEF DESCRIPTION OF THE SEVERAL VIEWS OF THE DRAWINGS

The present invention is described hereinafter with reference to the accompanying drawings.

DETAILED DESCRIPTION OF THE INVENTION

The embodiments of the invention shown in FIGS. 3A-6B relate to an electronic switch.

Figure 3A:
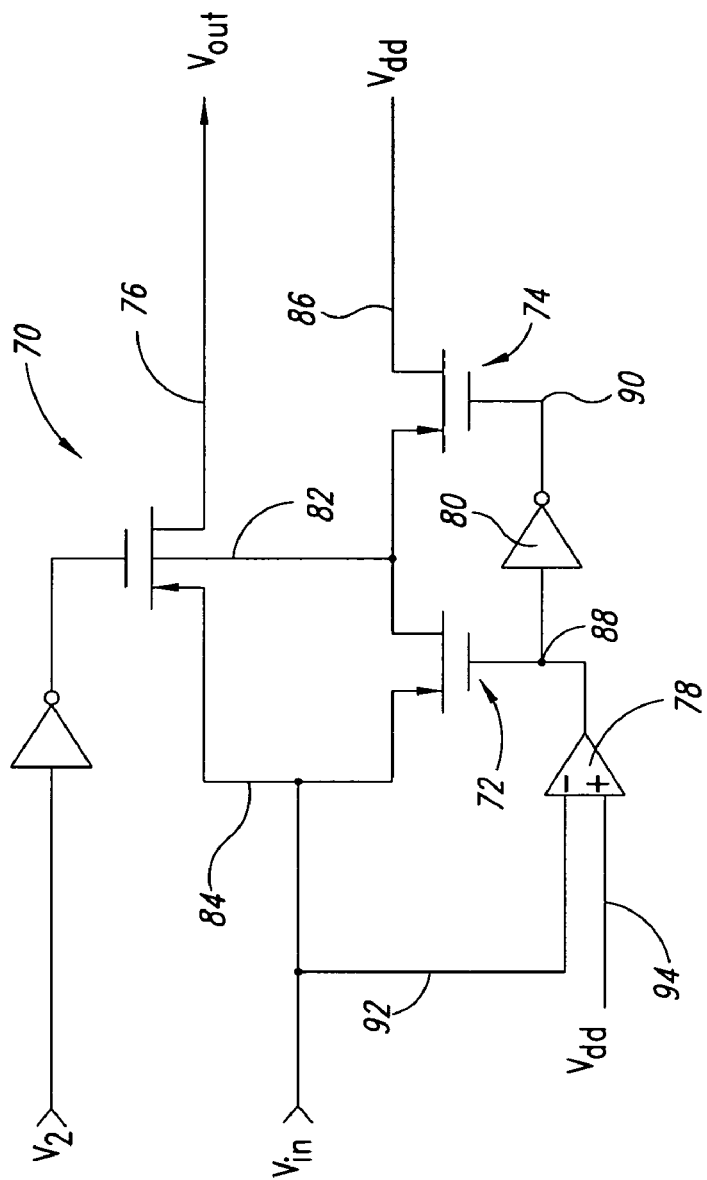
FIG. 3A is an electrical diagram of one embodiment of the invention.

FIG. 3A shows a P-channel analog switch 70, having an input terminal 84, a body 82 and an output terminal 76. The switch 70 is protected from voltages that exceed the positive voltage rail on the input terminal 84 of transistor 70. A comparator 78 has a first input 92 coupled to the input terminal 84 of the switch 70 and a second input 94 coupled to a voltage supply node 86, in this example, the positive voltage rail, Vdd. The comparator 78 is used to detect whether the input terminal 84 voltage of transistor 70 goes higher than the positive voltage rail, and if so, then the comparator 78 switches the N-well body 82 of the transistor 70 to the higher potential level of the input terminal 84 voltage and the positive voltage rail. Coupling the body 82 to the higher voltage prevents forward biasing of p-n junctions in parasitic transistors and thus, reduces or may stop any current paths that would otherwise take place.

Figure 2:
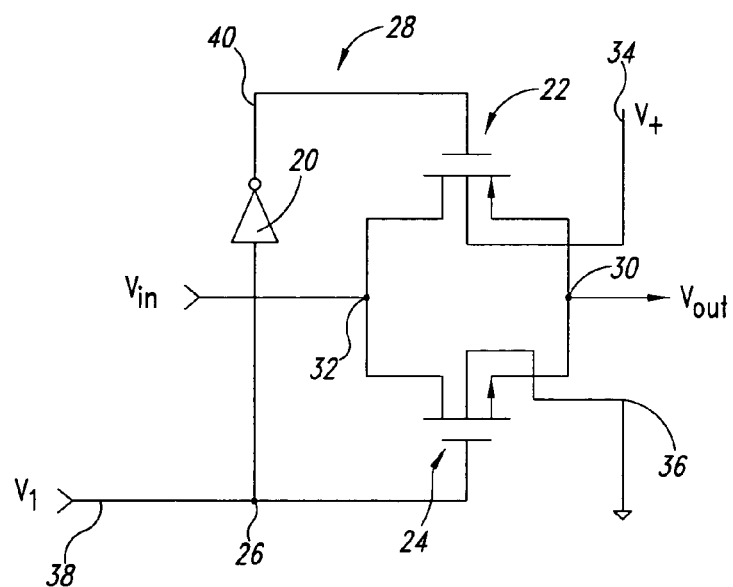
FIG. 2 is an electrical diagram of a typical CMOS switch.

When the comparator 78 detects the input terminal 84 voltage to be higher than the positive voltage rail, an output 88 of the comparator 78 goes electrically low and transistor 72 is turned ON connecting the N-well body 82 to input terminal 84 voltage and reverse biasing the p-n junction formed at the body-to-source region. At the same time, inverter 80 has a high output forcing transistor 74 to be off, to disconnect the body from the positive voltage rail Vdd. During normal operation when the input terminal 84 voltage does not exceed the positive voltage rail, the output 88 of the comparator 78 is electrically high, so the body 82 is connected to positive voltage rail Vdd through transistor 74 which is ON and the transistor 72 is off. In this input voltage range, the parasitic bipolar transistor is cut off and leakage current is reduced or eliminated. In summary, when the input voltage is within the normal range between Vdd and ground, the body of the P-channel transistor 70 is coupled to Vdd, and this P-channel transistor operates as in prior art circuits, for example, like transistor 22 shown in FIG. 2. When, however, the input voltage goes higher than the supply rail Vdd, the body is switched to the input, thereby preventing the parasitic emitter of the body-source diode from turning on, and thereby preventing undesirable parasitic bipolar currents. Of course, for input voltages less than ground, the P-channel switch transistor 70 of FIG. 3 does not have any junctions that can be forward biased, so the only voltage region of risk for this parasitic bipolar transistor current is when the input voltage is positive and above Vdd.

Figure 3B:
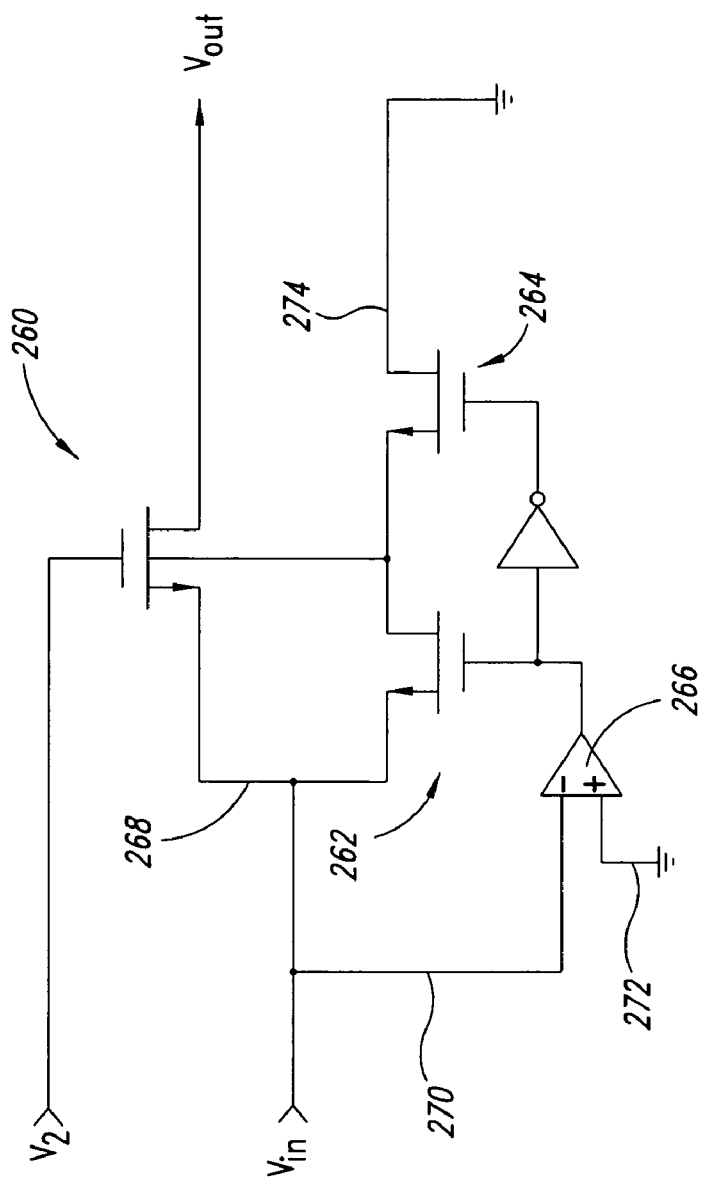
FIG. 3B is an electrical diagram of a dual circuit of FIG. 3A.

Another embodiment of the invention is shown in FIG. 3B. This embodiment is the dual of the circuit shown in FIG. 3A, where transistors 260, 262 and 264 are N-channel transistors and replace the transistors 70, 72 and 74 of the circuit of FIG. 3A, respectively. Furthermore, an input terminal 268 is coupled to the negative input terminal 270 of a comparator 266 and a positive input terminal 272 of the comparator 266 is coupled to ground. The operation of this circuit is otherwise similar to the circuit of FIG. 3A, as described above, except that the parasitic bipolar transistor may potentially be activated by an input signal that goes below ground, rather than above the positive rail.

Figure 4:
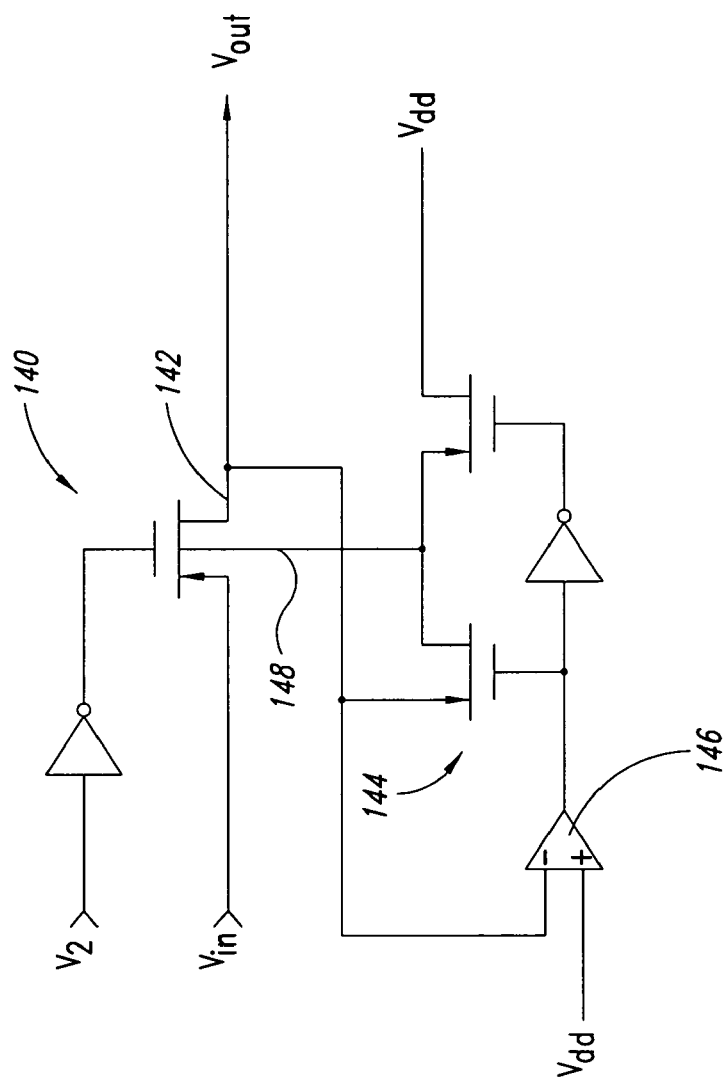
FIG. 4 is an electrical diagram of a second embodiment of the invention.

FIG. 4 shows a circuit similar to that shown in FIG. 3A, except that the output node is protected, rather than the input node. Namely, the output node 142 of the switch 140 is compared to the positive voltage rail by comparator 146. The operation of this circuit is substantially the same as that of the circuit shown in FIG. 3A. Specifically, the comparator 146 compares the positive voltage rail to the output voltage Vout. If the output voltage Vout is greater than the positive voltage rail, then transistor 144 is enabled and couples the body 148 of transistor 140 to the output voltage Vout to reduce or stop current leakage through a parasitic transistor, as described above.

Figure 5:
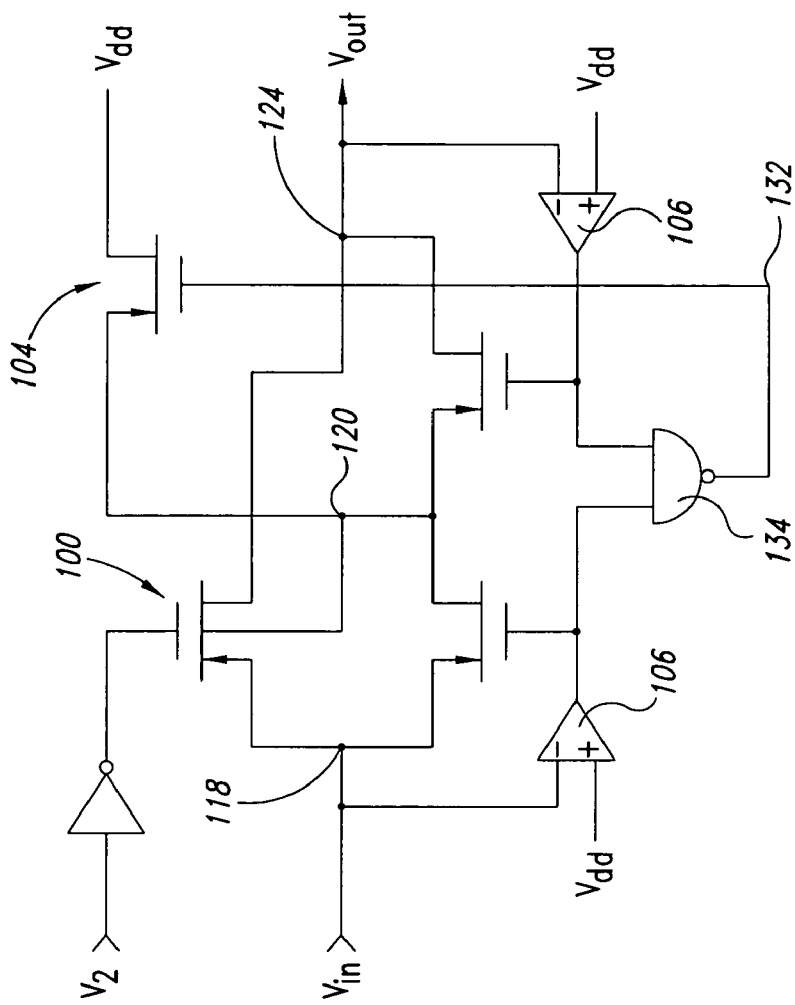
FIG. 5 is an electrical diagram of a third embodiment of the invention.

FIG. 5 shows an alternate embodiment of the invention with a P-channel switch 100. In this embodiment, a well-switching arrangement connects the body 120 of transistor 100 to the highest potential of either its source 118, its drain 124, or positive voltage rail. The logic NAND-gate 134 has at its output 132 a logic zero (low) when both inputs are at logic one (high), which can only happen if both the source 118 and the drain 124 are less than the positive voltage rail, in which case the body 120 is connected to positive voltage rail through the enabled transistor 104. If either the source 118 or the drain 124 goes above the positive voltage rail, then NAND-gate 134 changes state of output 132 from low to high, disabling transistor 104 and causing the coupling of the body 120 to one of the switch terminals 118 or 124, whichever that exceeded the positive voltage rail.

Figure 6A:
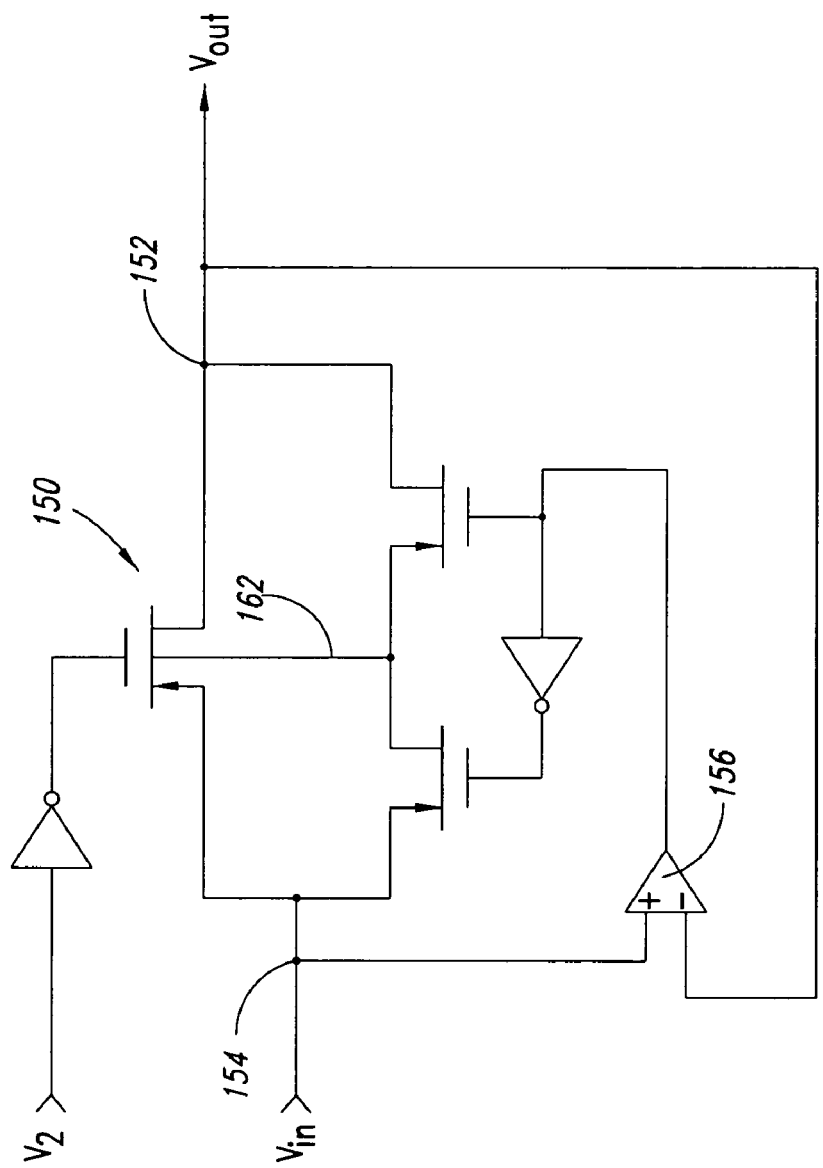
FIG. 6A is an electrical diagram of a fourth embodiment of the invention where the output terminal of the switch is used in voltage comparison.

Another embodiment of the invention is shown in FIG. 6A. In this embodiment the body 162 of transistor 150 is coupled to either the source 154 or the drain 152 and is never coupled with the positive voltage rail (not shown in this figure). The operation is otherwise substantially the same as the previous embodiments described above. This embodiment requires fewer components that the previous ones and prevents any bipolar conduction, regardless of whether the source 154 voltage is higher than the drain 152 voltage or positive voltage rail. Also, because the circuit is symmetrical the roles of source and drain may change depending on applied voltages in the circuit. A similar body-switching arrangement for N-channel devices can be easily provided using dual circuits to circuits shown in FIGS. 3A, 4, 5 and 6A.

Figure 6B:
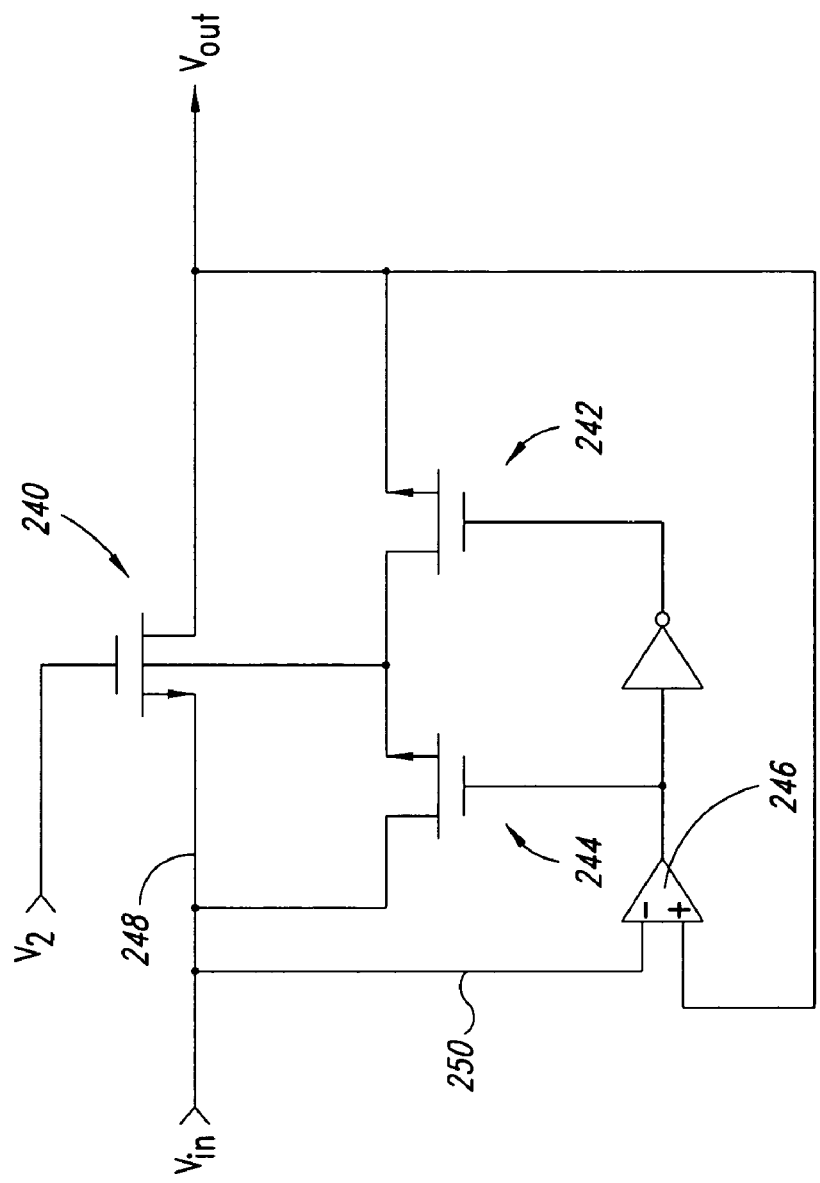
FIG. 6B is an electrical diagram of a dual circuit of FIG. 6A.

Another embodiment of the invention is shown in FIG. 6B. This embodiment is the dual of the circuit shown in FIG. 6A, where transistors 240, 242 and 244 are N-channel transistors and replace the transistors 150, 158 and 160 of the circuit of FIG. 6A, respectively. Furthermore, input terminal 248 is coupled to the inverting input terminal 250 of the comparator 246. The operation of this circuit is otherwise similar to the circuit of FIG. 6A, as described above.

Figure 1:
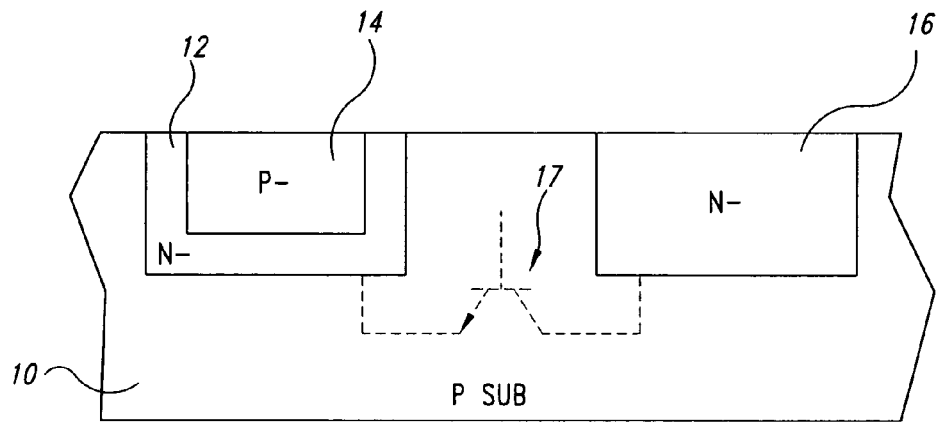
FIG. 1 is a cross-section view of a substrate for an integrated circuit.

While only a single-conductivity switch has been shown in the figures discussed above, it is clear that the embodiments of the invention discussed here are equally applicable to full CMOS circuits. That is, a CMOS analog switch could be achieved with a combination of the appropriate components from the circuits shown and their duals, such as the circuits in FIGS. 6A and 6B. The result would be a CMOS analog switch that would be protected from parasitic bipolar injection from either voltages lower than ground or higher than the supply. Further, the invention can be used in many substrates in addition to that shown in FIG. 1. Namely, it can be used in a standard CMOS substrate, a epitaxial layer on a substrate of an opposite type of conductivity; and numerous other types of substrate doping profiles.

Figure 7A:
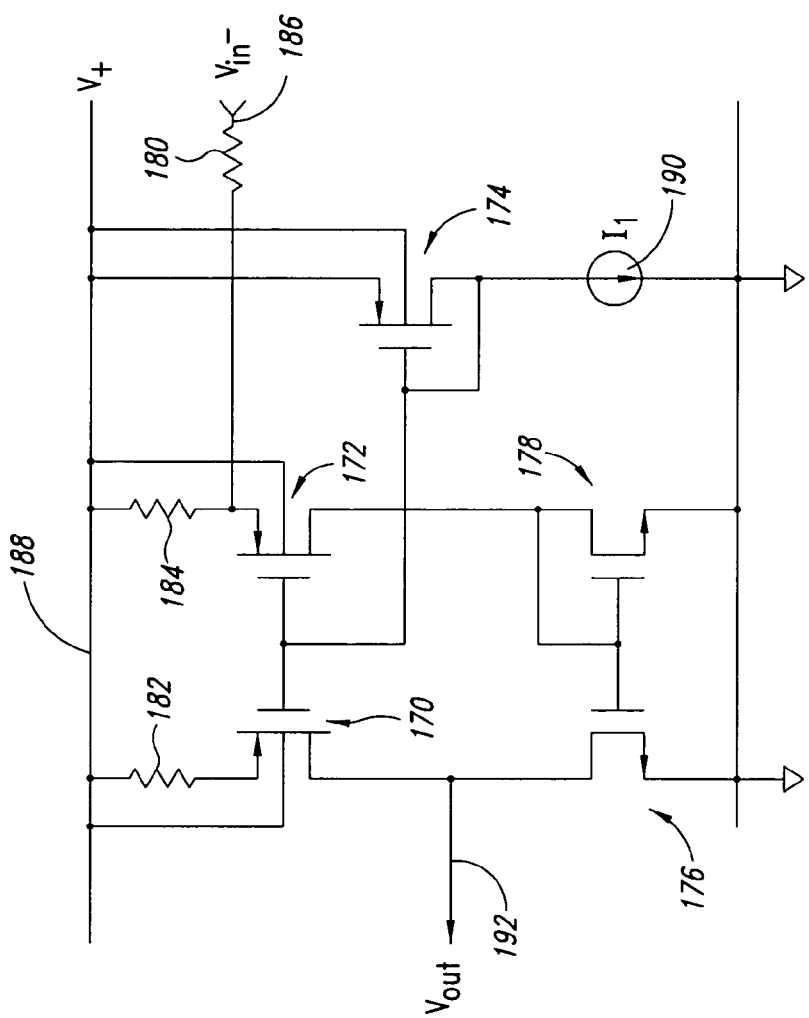
FIG. 7A is an electrical diagram of a comparator which can be used with the embodiment shown in FIGS. 3A, 4 and 5.

Circuits used for comparators 78, 266, 146, 106, 108, 156 and 246 to detect which of two input voltages is greater may be implemented in any one of a number of known ways, including diode OR circuits and comparators. A comparator is shown in FIG. 7A that is suitable for use in the circuits shown in FIGS. 3A, 4 and 5. In this embodiment, transistors 170, 172, 174, 176, and 178 have a known geometrical relationship at device construction level, such as 1:1:1:1:1. Likewise, resistors 180, 182 and 184 have a known relationship between their respective values, such as 2:1:2. In this configuration a balance condition exists between the transistors for when the voltage on input node 186 is equal to the voltage rail 188. For input node 186 voltages greater than the voltage rail 188, transistor 172 conducts more than transistor 170 and since transistor 170 operates with a quiescent current related to current source 190, the output node 192 pulls low to ground through transistor 176. This output state is an indication that input voltage is greater than the voltage rail. Furthermore, the input resistors 180 and 184 form a resistive attenuator to allow the voltage on input node 186 to go substantially above the voltage rail 188 without the source-body junction of transistor 172 being forward biased. As such, resistors 180 and 182 are preferred to be constructed from a region on the device substrate that does not have a parasitic diode to the voltage rail 188. Suitable materials would include poly-silicon resistors, or N+ resistors in the P-type well or substrate, among others. The values of the resistors 180 and 184 of FIG. 7A do not have to be equal as described immediately above; instead, for example, if resistor 180 were larger than 184, then more attenuation of input signal 186 would occur, and higher input signals could be received without much change in the source voltage of transistor 172. Of course, this change in resistors 180 & 184 may necessitate a corresponding change in resistor value 182 in order to achieve the desired balance or trip point.

To summarize the architecture of this comparator, there is a pair of current sources providing, at balance, two currents of a predetermined value (not necessarily equal) to a current mirror. The current mirror may be of numerous known implementations, but will have a control input terminal for receiving an input current, and an output terminal for sourcing or sinking an output current.

One embodiment of the comparator allows an input signal to be compared to change the relationship of the two currents of the current sources. Since the current mirror receives and mirrors only one of these currents, a difference in current at the output of the current mirror will rapidly cause the voltage at this output node to change, since this is a very high impedance node. (FIG. 7A represents this embodiment.)

Figure 7B:
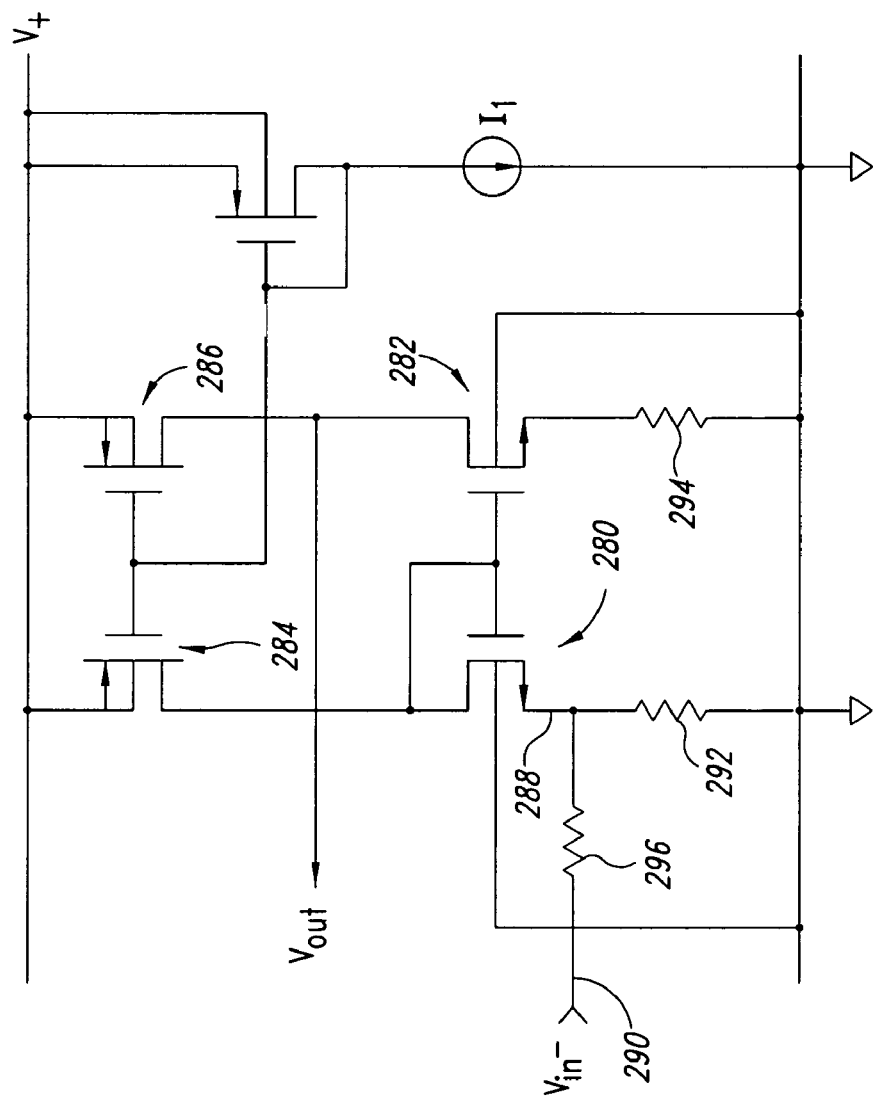
FIG. 7B is an electrical diagram of a dual of circuit of FIG. 7A which can be used with the embodiments shown in FIG. 3B.

Other versions of this comparator are possible, as would be recognized by a person of ordinary skill. The input signal may be brought in to change the predetermined relationship of the current mirror, rather than to change the relationship of the current sources. (FIG. 7B represents this embodiment.) Further, other changes could occur which could exchange N-channel current sources for the P-channel ones shown in FIGS. 7A & 7B, or one could switch the current source input for output, making for example in FIG. 7A, 176 the diode connected transistor, and then taking the output from the drain of 178. This change would cause the input 186 to be a non-inverting input. By adding an extra resistor as shown in FIG. 7C, the two inputs to the comparator are both independent, and may be used to compare two voltages with respect to one another, neither one necessarily being the positive supply voltage Vdd.

Another variation would have different biasing arrangements to bias up the voltage of the gates of the current sources. Once such variation may be the addition of a resistor in series with the source of transistor 174 of FIG. 7A, changing the relationship between I1 and the quiescent current at balance of transistors 170 & 172. Other changes are possible, including cascode devices, Wilson current mirrors, and many others.

While the comparator circuit of FIG. 7A operates with voltages near the positive voltage supply, FIG. 7B shows a comparator circuit that operates with voltages near ground. In FIG. 7B resistors 292, 296 and 294 are coupled with transistors 280 and 282, respectively. Transistors 284 and 286 are coupled between the positive voltage supply and ground. Furthermore an input terminal 288 of transistor 280 receives an input node 290 voltage, similar to input node 186. Similar transistor size relationship used for the circuit of FIG. 7A can be used for the circuit of FIG. 7B.

Figure 7C:
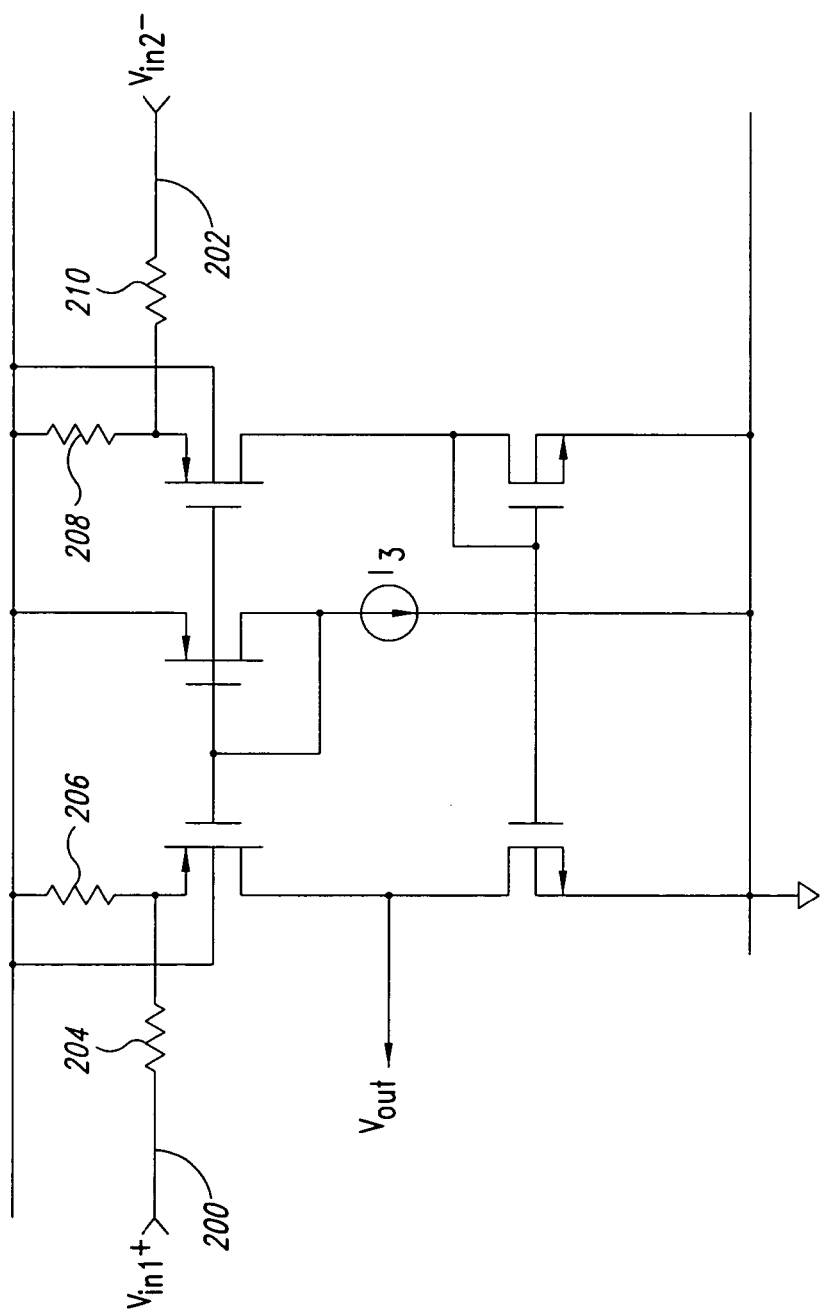
FIG. 7C is an electrical diagram of a comparator which, is a modification of that shown in FIG. 7A and can be used with the embodiment shown in FIG. 6A for comparison of each of two inputs to one another.

FIG. 7C shows a modification of the comparator of circuit shown in FIG. 7A which allows the comparison of the voltages on two input nodes 200 and 202 to one another. In this configuration, there are two resistive attenuators embodied in resistor pair 204 and 206, and resistor pair 208 and 210, one for each input node, respectively.

Figure 7D:
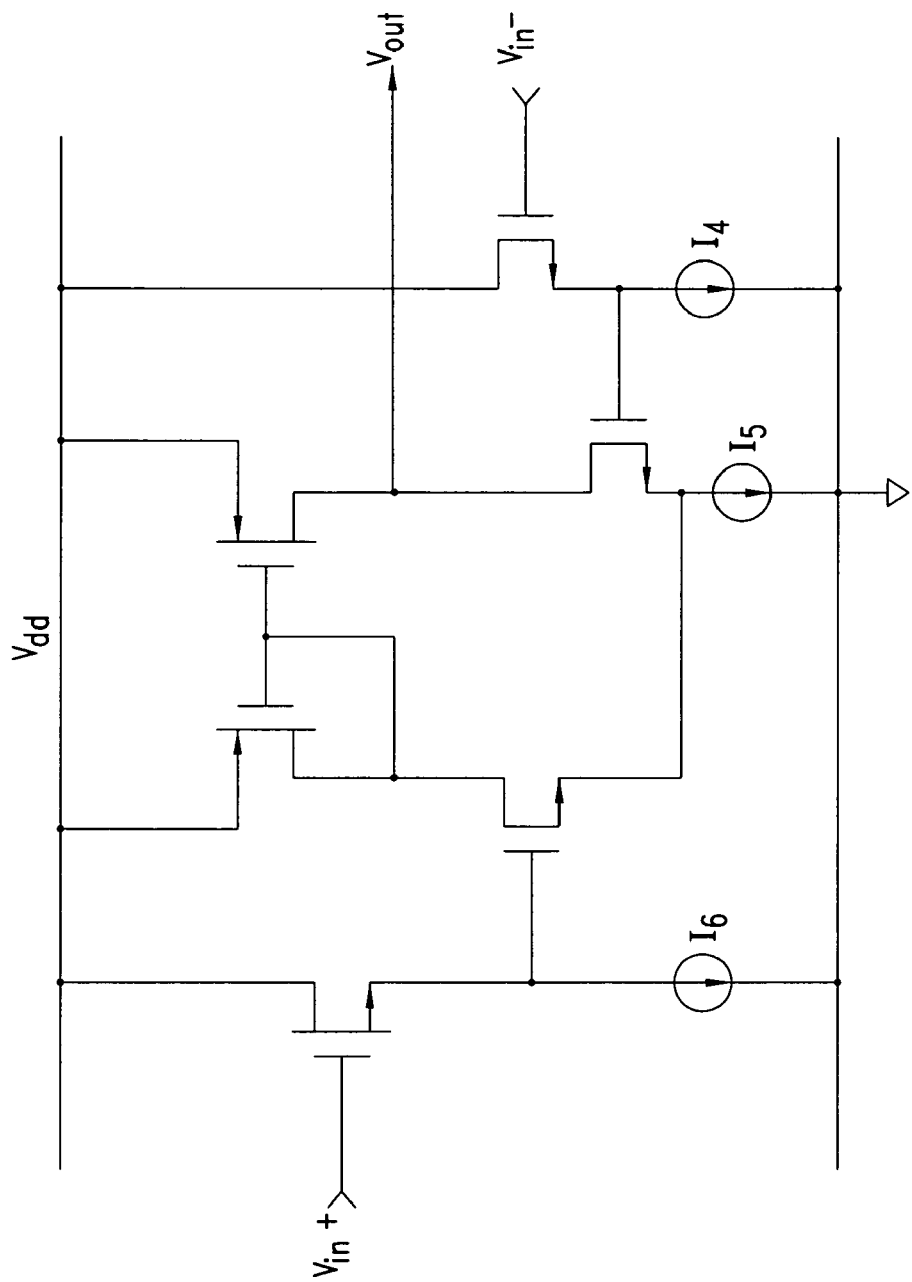
FIG. 7D is an electrical diagram of another comparator which, can be used with the embodiment shown in FIG. 6A for comparison of each of two inputs to one another.

FIG. 7D shows another comparator circuit which allows the comparison of two input voltages, Vin+ and Vin-. This comparator or its dual can be used with the circuits shown in FIGS. 5, 6A and 6B discussed above and is capable of comparing voltages greater than the positive rail and its dual is capable of comparing voltages less than the ground voltage without creating any bipolar parasitic behavior as discussed above.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A semiconductor circuit comprising:
   a switch having an input terminal, an output terminal and a body region;
   said input terminal configured to receive a voltage independent of a positive supply rail voltage and that can range below, equal to, or above the positive voltage rail;
   at least one comparator having a first input coupled to the input terminal and a second input coupled to the positive voltage rail; and
   logic coupled to an output of the comparator to be responsive to the output of the comparator to selectively couple the body region of the switch either to the input terminal or to the positive voltage rail.

2. The circuit of claim 1 wherein the logic comprises:
   a transistor having a control gate coupled to the output of the comparator and a first terminal coupled to the input terminal and a second terminal coupled to the body region.

3. The circuit of claim 2 wherein the logic further comprises:
   a second transistor having a control gate coupled to the output of the comparator, a first terminal coupled to the body region and a second terminal coupled to the positive voltage rail.

4. The circuit of claim 3 wherein the logic further comprises:
   a logic gate having a first terminal coupled to the control gate of the transistor and a second terminal coupled to a control gate of the second transistor, and the logic gate further having an output terminal coupled with a control gate of a third transistor.

5. The circuit of claim 4 wherein the logic further comprises:
   a first terminal of the third transistor coupled to the body region and a second terminal of the third transistor coupled to one of the positive voltage rail and the output terminal of the switch.

6. The circuit of claim 1 wherein the switch is a field effect transistor.

7. The circuit of claim 4 wherein all transistors are of the field effect transistor type.

8. A semiconductor circuit comprising:
   a first switching circuit having an input terminal, an output terminal, a control terminal and a body region;
   said output terminal configured to have thereon a voltage independent of a supply voltage and that can range above, below, or be equal to the supply voltage;
   a voltage comparison module having a first input terminal configured to receive an input voltage, and a second input terminal configured to receive a reference voltage, and an output terminal for indicating when the input voltage on the first input terminal exceeds the reference voltage on the second input terminal; and
   a biasing module having one terminal coupled to the body region, an input terminal coupled to the output terminal of the voltage comparison module, and a plurality of terminals coupled to respective, different nodes for selectively coupling the body region to one of the plurality of different nodes in the circuit.

9. The circuit of claim 8 wherein the voltage comparison module is an amplifier configured as a voltage comparator having two inputs and one output.

10. The circuit of claim 8 wherein the first input terminal of the voltage comparison module is coupled to the output terminal of the switch and is configured to receive the same voltage as present on the output terminal.

11. The circuit according to claim 8 wherein the first switching circuit includes a full CMOS switch having at least a P-channel transistor and an N-channel transistor.

12. The circuit according to claim 8 wherein the first switching circuit includes a single transistor that is an analog driven and operated transistor.

13. The circuit according to claim 8 wherein the second terminal of the voltage comparison module is coupled to a positive voltage rail.

14. The circuit according to claim 8 wherein the second terminal of the voltage comparison module is coupled to a negative voltage rail.

15. The circuit according to claim 8 wherein the second terminal of the voltage comparison module is coupled to the output terminal of the first switching circuit.

16. The circuit of claim 8 wherein the biasing module comprises:
   a second and a third switch, each switch having a first terminal, a second terminal and a control terminal, the second terminal of the second switch and the first terminal of the third switch being coupled to the body region of the first switch, and the first terminal of the second switch being coupled to the input terminal of the first switch and the second terminal of the third switch being coupled to the reference voltage.

17. A semiconductor circuit, comprising:
   a first switching circuit having an input terminal, an output terminal, a control terminal and a body region;
   said output terminal configured to have thereon a voltage independent of a supply voltage and that can range above, below, or be equal to the supply voltage;
   a first pair of switches of a particular type having a known geometric relationship to each other, each of the switches having an input terminal, an output terminal, a control terminal and a body region, the control terminals of each connected to the other, and the body region of one of the switches in the first pair of switches coupled to the body region of the other;
   a second pair of switches of a type which is complementary to the type of first pair of switches, having a known geometric relationship to each other, each of the switches having an input terminal, an output terminal and a control terminal, the input terminal of one of the switches in the second pair of switches being coupled to the output terminal of one of the switches in the first pair of switches, and the control gate of the one switch in the second pair of switches being coupled to the control gate of the other switch in the second pair of switches and the output terminal of the other switch in the first pair of switches, and the output terminal of both switches in the second pair of switches being coupled to each other;
   a second switch of the same type as the first pair of switches, the second switch having an input terminal, an output terminal, a control terminal and a body region, the input terminal of the second switch being coupled to the body region of the second switch and to the body region of the switches in the first pair of switches, and the control terminal of the second switch being coupled to the control terminals of the switches in the first pair of switches and to the output of the second switch;
   a current source having two terminals, one terminal of the current source being coupled to the output terminal of the second switch and the other terminal of the current source being coupled to the output terminals of the switches in the second pair of switches;
   three resistive elements having a known relationship to each other, each resistive element having two terminals, one terminal of a first resistive element being coupled to an input voltage and the other terminal of the first resistive element being coupled to the input terminal of one switch in the first pair of switches and to one terminal of a second resistive element, and the other terminal of the second resistive element being coupled to the body regions of the switches in the first pair of switches and to one terminal of a third resistive element, and the other terminal of the third resistive element being coupled to the input terminal of the other switch in the first pair of switches; and
   a biasing module having one terminal coupled to the body region, an input terminal coupled to the output terminal of the voltage comparison module, and a plurality of terminals coupled to respective, different nodes for selectively coupling the body region to one of the plurality of different nodes in the circuit.

18. A method for operating a semiconductor circuit comprising:
   receiving a variable voltage at an input terminal of a switch in the semiconductor circuit, the voltage varying in a range from below, equal to, and above a positive voltage rail during different times of operation;
   sensing a plurality of voltage levels in the semiconductor circuit, at least one of the voltage levels varying with time during operation of the circuit;
   comparing the values of two of the voltage levels to each other; and
   coupling a body region of the switch in the semiconductor circuit to the voltage closest to the switch's source voltage based on the comparison, the coupling of the body region preventing a forward biasing of a p-n junction associated with the body region.

19. The method of claim 18 wherein the sensing of the voltage levels comprises:
   coupling the voltage levels to the inputs of a comparator.

20. The method of claim 18 wherein the comparing of the values of two of the voltage levels to each other comprises:
   coupling the voltage levels to the inputs of a comparator.

21. The method of claim 18 wherein the coupling of the body region comprises:
   enabling a transistor that selectively connects the body region to the higher of the voltages.

22. A method for operating a semiconductor circuit comprising:
   receiving a variable voltage at an input terminal of a switch in the semiconductor circuit, the voltage varying in a range from below, equal to, and above a ground rail during different times of operation;
   sensing a plurality of voltage levels in the semiconductor circuit, at least one of the voltage levels varying with time during operation of the circuit;
   comparing the values of two of the voltage levels to each other; and
   coupling a body region of the switch in the semiconductor circuit to the lower of the voltages based on the comparison, the coupling of the body region preventing a forward biasing of a p-n junction associated with the body region.

23. The method of claim 22 wherein the sensing of the voltage levels comprises:
coupling the voltage levels to the inputs of a comparator.

24. The method of claim 22 wherein the comparing of the values of two of the voltage levels to each other comprises:
coupling the voltage levels to the inputs of a comparator.

25. The method of claim 24 wherein the coupling of the body region comprises:
enabling a transistor that selectively connects the body region to the lower of the voltages.

26. A semiconductor circuit comprising:
a switch having an input terminal, an output terminal and a body region;
said input terminal configured to receive a voltage independent of a ground and that can range below, equal to, or above the ground;
at least one comparator having a first input coupled to one of the terminals and a second input coupled to the ground; and
logic coupled to an output of the comparator to be responsive to the output of the comparator to selectively couple the body region of the switch to one of the terminals or to the ground.

27. The circuit of claim 26 wherein the logic comprises:
a transistor having a control gate coupled to the output of the comparator and a first terminal coupled to the input terminal and a second terminal coupled to the body region.

28. The circuit of claim 27 wherein the logic further comprises:
a second transistor having a control gate coupled to the output of the comparator, a first terminal coupled to the body region and a second terminal coupled to the ground.

29. The circuit of claim 28 wherein the logic further comprises:
a logic gate having a first terminal coupled to the control gate of the transistor and a second terminal coupled to a control gate of the second transistor, and the logic gate further having an output terminal coupled with a control gate of a third transistor.

30. The circuit of claim 29 wherein the logic further comprises:
a first terminal of the third transistor coupled to the body region and a second terminal of the third transistor coupled to one of the ground and the output terminal of the switch.

* * * * *